(12) United States Patent
Buhler et al.

(10) Patent No.: US 7,271,985 B1
(45) Date of Patent: Sep. 18, 2007

(54) SYSTEM AND METHOD FOR CROSSTALK REDUCTION IN A FLEXIBLE TRACE INTERCONNECT ARRAY

(75) Inventors: Otto Richard Buhler, Boulder, CO (US); Jeffrey Glenn Villiard, Broomfield, CO (US); Kevin Dale McKinstry, Arvada, CO (US); Ricky Lee Ewasko, Boulder, CO (US)

(73) Assignee: Storage Technology Corporation, Louisville, CO (US)

( * ) Notice: Subject to any disclaimer, the term of this patent is extended or adjusted under 35 U.S.C. 154(b) by 411 days.

(21) Appl. No.: 10/949,654

(22) Filed: Sep. 24, 2004

(51) Int. Cl.
*G11B 5/48* (2006.01)
(52) U.S. Cl. .................... 360/245.9; 360/246
(58) Field of Classification Search ............ 360/245.8, 360/245.9, 246
See application file for complete search history.

(56) References Cited

U.S. PATENT DOCUMENTS

| | | | |
|---|---|---|---|
| 3,761,842 A | 9/1973 | Gandrud | |
| 3,764,727 A | 10/1973 | Balde | |
| 4,418,239 A | 11/1983 | Larson et al. | |
| 4,785,135 A | 11/1988 | Ecker et al. | |
| 5,039,824 A * | 8/1991 | Takashima et al. | 174/33 |
| 5,397,862 A | 3/1995 | Bockelman et al. | |
| 5,430,247 A | 7/1995 | Bockelman | |
| 5,805,382 A * | 9/1998 | Lee et al. | 360/244.1 |
| 6,057,512 A | 5/2000 | Noda et al. | |
| 6,249,404 B1* | 6/2001 | Doundakov et al. | 360/245.4 |
| 6,300,846 B1* | 10/2001 | Brunker | 333/1 |
| 6,424,499 B1 | 7/2002 | Balakrishnan et al. | |
| 6,433,272 B1 | 8/2002 | Buhler et al. | |
| 6,559,377 B1* | 5/2003 | Noda et al. | 174/36 |
| 6,593,900 B1* | 7/2003 | Craven et al. | 343/895 |
| 7,126,482 B2* | 10/2006 | Shoji et al. | 340/572.7 |
| 2004/0070884 A1* | 4/2004 | Someya et al. | 360/245.9 |
| 2005/0180053 A1* | 8/2005 | Dovek et al. | 360/246 |
| 2005/0202697 A1* | 9/2005 | Caveney et al. | 439/77 |
| 2005/0219758 A1* | 10/2005 | Roth | 360/246 |
| 2005/0219759 A1* | 10/2005 | Roth | 360/246 |
| 2005/0280944 A1* | 12/2005 | Yang et al. | 360/245.9 |

FOREIGN PATENT DOCUMENTS

| | | |
|---|---|---|
| EP | 0 134 899 A | 3/1985 |
| EP | 0 855 854 A | 7/1998 |
| JP | 2004227891 | 12/2003 |

* cited by examiner

*Primary Examiner*—Jefferson Evans
(74) *Attorney, Agent, or Firm*—Brooks Kushman P.C.

(57) ABSTRACT

A system for reducing signal crosstalk in a flexible trace interconnect array includes a flexible dielectric material base, and a plurality of conductors longitudinally arranged as pairs in a signal layer array on the base. At least one of the pairs of conductors comprises a twisted pair.

17 Claims, 2 Drawing Sheets

US 7,271,985 B1

SYSTEM AND METHOD FOR CROSSTALK REDUCTION IN A FLEXIBLE TRACE INTERCONNECT ARRAY

BACKGROUND OF THE INVENTION

1. Field of the Invention

The present invention relates to a system and a method for crosstalk reduction in a flexible trace interconnect array.

2. Background Art

Flexible trace interconnect arrays (so-called flex circuits) are used in tape head assemblies to connect the recording head to respective read and write circuitry. The flexible trace interconnect arrays are constructed primarily of pairs of conductive traces disposed on or in a flexible dielectric material. The conductive traces connect the read and write elements of the tape head to the respective read and write circuits.

In conventional flexible trace interconnect arrays, individual trace pairs couple, both capacitively and inductively, with other trace pairs that are in close proximity (i.e., neighboring traces) due to the density of the traces. Such coupling can cause undesirable crosstalk in signals that are transmitted (i.e., presented and received) using the flexible trace interconnect arrays.

Conventional approaches that have been implemented in an attempt to reduce or eliminate the coupling and crosstalk between trace pairs that are in close proximity to each other in flexible trace interconnect arrays include using conductive shielding to separate trace pairs, implementing "pseudo-twisted" pairs of trace arrays, and physically separating horizontal and vertical distances between flexible trace interconnect array conductor pairs. However, such conventional approaches typically fail to effectively reduce or eliminate the coupling and crosstalk between trace pairs that are in close proximity in flexible trace interconnect arrays, especially in high density implementations.

Thus there exists an opportunity and need for an improved system and method for cost effectively reducing or eliminating coupling and crosstalk in connection with flexible trace interconnect array conductor pairs.

SUMMARY OF THE INVENTION

The present invention generally provides a system and a method for new, improved and innovative techniques for crosstalk reduction in a flexible trace interconnect array for multi-channel tape heads. The present invention generally provides a system and a method for a true twisted pair conductor implementation in a flexible trace interconnect array.

According to the present invention, a system for reducing signal crosstalk in a flexible trace interconnect array is provided. The system comprises a flexible dielectric material base, and a plurality of conductors longitudinally arranged as pairs in a signal layer array on the base. At least one of the pairs of conductors comprises a twisted pair.

Also according to the present invention, a method for reducing signal crosstalk in a flexible trace interconnect array is provided. The method comprises disposing a plurality of conductors arranged as pairs in an array on a flexible dielectric material base, and forming at least one of the pairs of conductors as a twisted pair.

Further, according to the present invention, a flexible trace interconnect array is provided. The array comprises a flexible dielectric material base, a plurality of trace conductors disposed as pairs along a longitudinal axis of the base, and a crossover section formed as a true twist in at least one of the conductor pairs.

The above features, and other features and advantages of the present invention are readily apparent from the following detailed descriptions thereof when taken in connection with the accompanying drawings.

BRIEF DESCRIPTION OF THE DRAWINGS

FIGS. 2(a-c) are diagrams of alternative implementations of a flexible trace array according to the present invention;

DETAILED DESCRIPTION OF THE PREFERRED EMBODIMENT(S)

With reference to the Figures, the preferred embodiments of the present invention will now be described in detail. Generally, the present invention provides an improved system and method that implements new and innovative techniques for a flexible trace interconnect array having mitigated, reduced or eliminated crosstalk between conductor pairs when compared to conventional approaches. The improved system and method of the present invention generally provides for including one or more true twists in a trace pair that is implemented in a flexible trace interconnect array.

Figures 1, 2A, 2B, 2C:
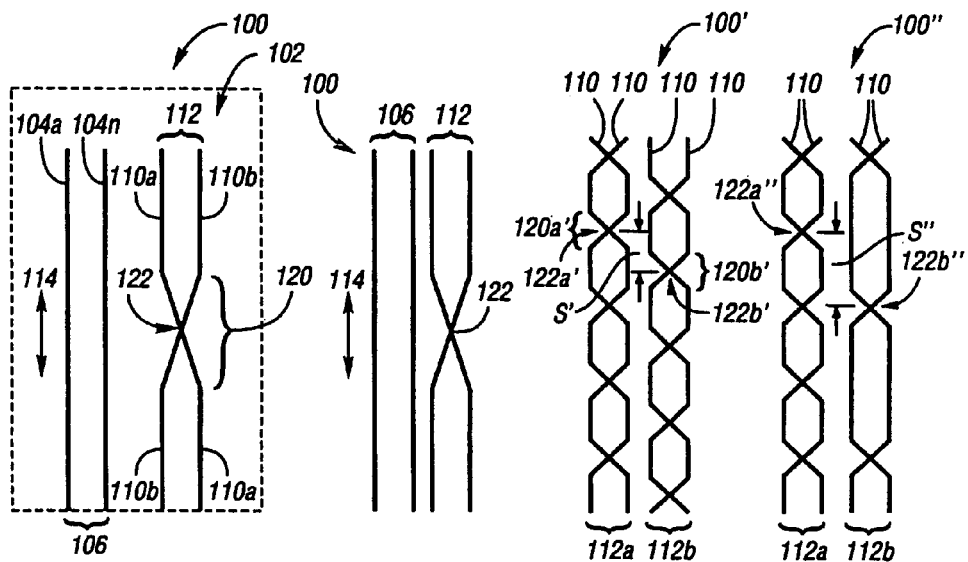
FIG. 1 is a diagram of a flexible trace array according to the present invention.

Referring to FIG. 1, a diagram illustrating a top view of a flexible trace conductor interconnect array 100 of the present invention is shown. The interconnect array 100 may be advantageously implemented in connection with respective multi-channel tape head read/write circuitry (not shown) in a data storage system (not shown). The interconnect array 100 may be implemented in connection with any multi-channel signal communication (i.e., transmission and reception, presenting or sending and receiving, etc.) application that includes a flexible trace conductor interconnect array.

The array (e.g., system, apparatus, etc.) 100 generally comprises a flexible dielectric material base (e.g., film, sheet, flexible substrate, and the like) 102 (shown in phantom), a plurality of trace conductors (e.g., leads, wires, etc.) 104 (e.g., traces 104a-104n) that comprise a substantially parallel trace group (e.g., a pair of traces 104, a single lead 104, a plurality of traces 104, etc.) 106, and at least one pair of trace conductors 110a and 110b that comprise a twisted pair 112.

The twisted pair 112 generally includes a crossover section (i.e., portion, lead, link, wire, conductor, part, etc.) 120, and has a crossover point 122. The twisted pair 112 (i.e., the traces 110a and 110b) are generally substantially parallel except at the region where the twist is implemented using the section 120. The traces 104 and 110 generally comprise flexible conductors that are disposed (e.g., deposited, coated, sputtered, electroformed, plated, laminated, silk-screened, layered, etc.) longitudinally (i.e., disposed in a direction 114) as a signal layer in or on the dielectric material 102. The crossover point 122 is generally the location where the leads 110a and 110b cross over each other and proceed to a parallel path.

The dielectric material film 102 is generally implemented as an electrically insulating (i.e., non-conducting) material such as polyimide, rubber, teflon, mylar, and the like. However, the base 102 may be implemented using any appropriate (or suitable) flexible dielectric material to meet the design criteria of a particular application.

The trace conductors 104 and 110 are generally made from (i.e., produced from, implemented using, etc.) at least one electrically conductive material (e.g., gold, silver, copper, aluminum, and the like). However, the conductors 104 and 110 may be implemented using any appropriate (or suitable) electrically conductive material to meet the design criteria of a particular application.

The trace pair 106 (e.g., the traces 104a and 104n) may be implemented as parallel trace conductors. The twisted pair 112 generally includes at least one crossover 122. The flexible trace conductor interconnect array 100 generally has a length that is shorter than a wavelength of a signal of interest. As such, signal coupling and crosstalk generally occur between traces pairs that are in close physical proximity to one another.

However, in contrast to conventional approaches where true twisting is absent (i.e., not implemented), the true twisted pair 112 generally has a signal polarity reversal at the crossover point 122 (i.e., polarity reversal of a signal carried on the conductor pair 112). The polarity reversal of the signal coupling and crosstalk generally yields a net coupling that is substantially zero (i.e., the crosstalk is substantially eliminated). The twisted pair conductors 112 may be implemented in connection with read lines, write lines or both read lines and write lines (i.e., at least one of read lines and write lines).

In one example, the twisted pair conductors 112 may be implemented in connection with one or more shield layers (i.e., layers of a generally flexible conductive material that are generally implemented in the interconnect array 100 to provide electrical shielding between layers or conductors). In another example, the twisted pair conductors 112 may be implemented in connection with an interconnect array 100 that is implemented without shield layers.

Referring to FIGS. 2(a-c), alternative example implementations of the flexible trace conductor interconnect array 100 (e.g., arrays 100, 100', and 100") are shown. FIG. 2a illustrates an example implementation that comprises the parallel conductor pair 106 and the twisted conductor pair 112. The crossover 122 may be implemented at approximately (i.e., about) equal to half the total length of the interconnect array 100. In another example implementation of the present invention, the location of the crossover 122 may be selected (i.e., tuned, determined, chosen, etc.) such that crosstalk is minimized for a signal having the lowest frequency that is normally transmitted in the array 100.

FIG. 2b illustrates an example implementation (i.e., the array 100') having two twisted conductor pairs 112 (e.g., conductor pair 112a and conductor pair 112b). The respective crossover points 122 of the conductor pairs 112 (e.g., crossover point 122a and crossover point 122b) may be longitudinally separated by a distance (or length), S', that may be substantially equal to one half a wavelength of a signal of interest (e.g., a signal having the lowest frequency that is normally transmitted in the array 100'). In another example implementation of the present invention, the distance S' may be selected (i.e., tuned, determined, chosen, etc.) such that crosstalk is minimized for a signal having the lowest frequency that is normally transmitted in the array 100'.

FIG. 2c illustrates another example implementation (i.e., the array 100") having two twisted conductor pairs 112. The longitudinal separation distance S between the crossover points 122 may be implemented as generally randomly unequal distances.

Figure 3A:
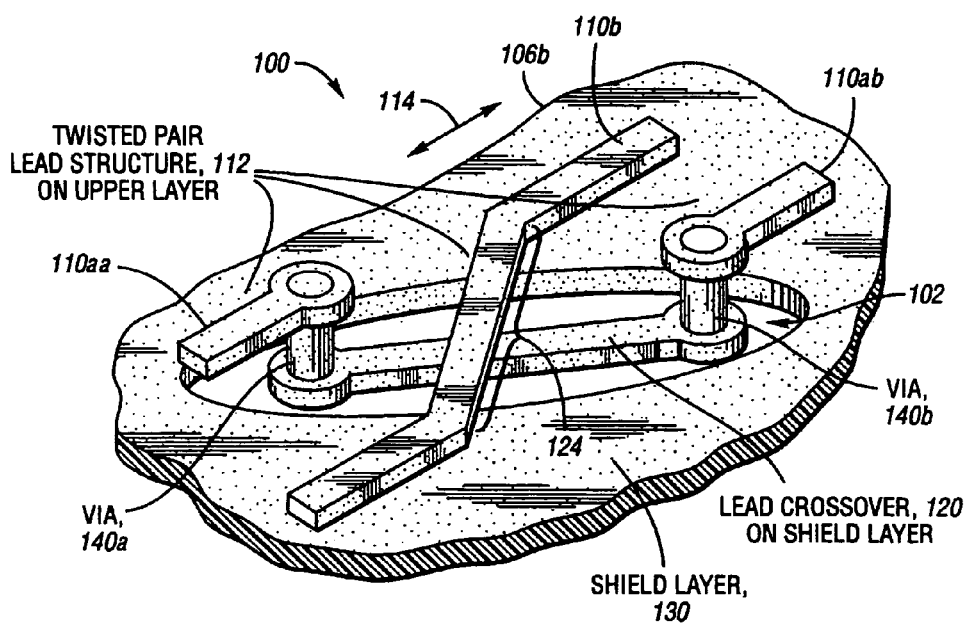
FIGS. 3(a-b) are isometric diagrams of alternative implementations of a twisted conductor pair in a flexible trace array according to the present invention.

Referring to FIG. 3a, an isometric view illustrating an example implementation of the true twisted conductor pair 112 in the flexible trace conductor array 100 of the present invention is shown. The flexible trace conductor array 100 that is illustrated in FIG. 3a may include a shield layer 130 that is disposed on the side of the base 102 that is opposite the traces 112.

The crossover lead 120 may be formed as a section of the shield 130 that is insulated from the remainder of the shield 130 by the dielectric base material 102. Vias 140 (e.g., vias 140a and 140b) may be plated through the dielectric 102 to produce the serially continuous conductor 110a. A first section of the trace 110a (e.g., section 110aa) may have an end that is serially connected to a first end of the link 120 by the via 140a. A second section of the trace 110a (e.g., section 110ab) may have an end that is serially connected to a second end of the link 120 by the via 140b. The trace 110b may include a zig-zag (e.g., "Z") shaped portion 124 on the top surface of the base 102 between the vias 140a and 140b such that the traces 110a and 110b are substantially parallel except for the region of the lead 120 where the twist formed by the vias 140 and the conductor section 120 in connection with the zig zag section 124 is implemented.

Figure 3B:
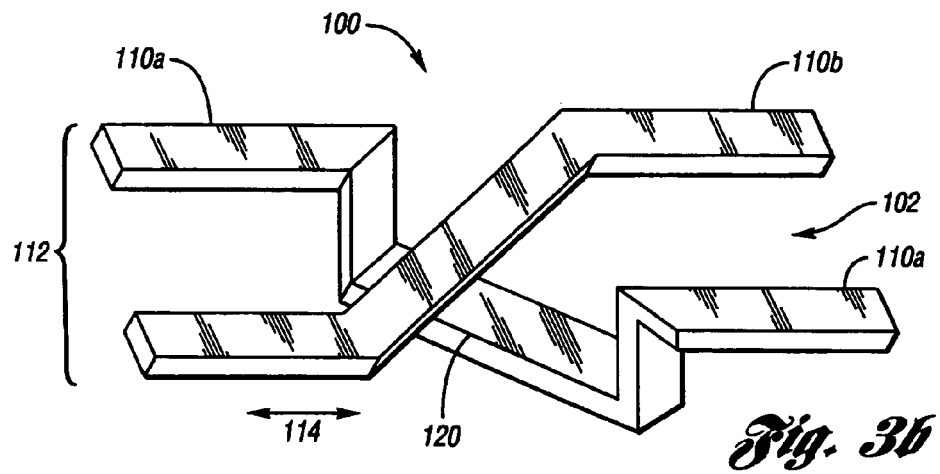

Referring to FIG. 3b, an isometric view illustrating another example implementation of the true twisted conductor pair 112 in the flexible trace conductor array 100 of the present invention is shown. The flexible trace conductor array 100 that is illustrated in FIG. 3b may be implemented by disposing (i.e., plating, embedding, and the like) the conductor section 120 of the trace 110a apart (i.e., separated, insulated, etc.) from the trace 110b. The dielectric material (i.e., the flex circuit 110 base) 102 generally separates the conductor twist portion 120 from the trace 110b.

Figure 4A:
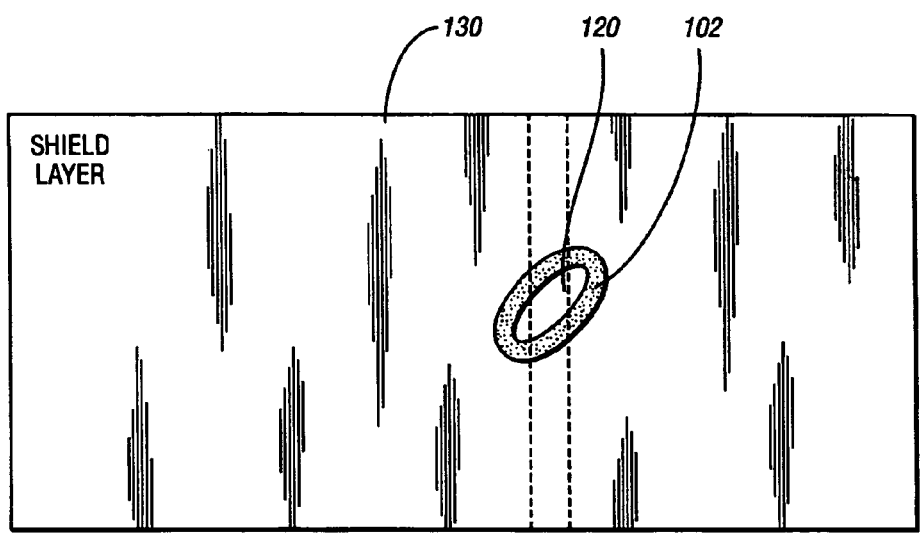
FIGS. 4(a-b) are detailed illustrations of a structure of a flexible trace array according to the present invention.
Figure 4B:
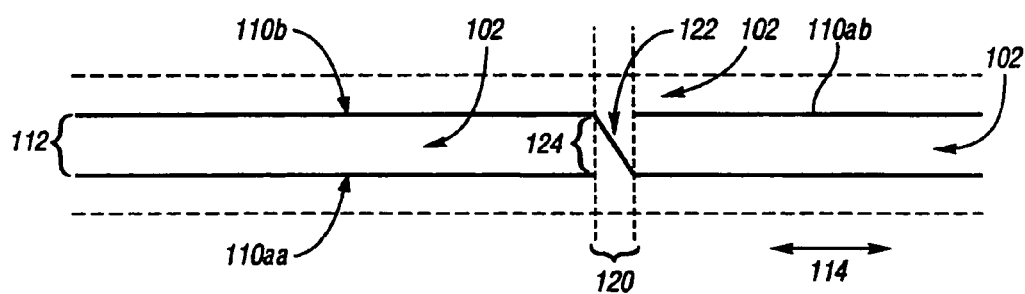

Referring to FIG. 4a, a diagram illustrating an implementation of the shield 130 and including the link 120 as a section of the shield 130 is shown. Referring to FIG. 4b, a diagram illustrating the traces 110 on the base 102 is shown. In the example implementation of the array 100 illustrated in FIGS. 4(a-b), the trace 110a uses the link section 120 of the shield 130 as the crossover, and the trace 110b has a crossover (e.g., the zig zag portion 124) in the signal layer to form the true twist of the twisted pair 112.

As is readily apparent from the foregoing description, then, the present invention generally provides an improved method and an improved system for a flexible trace interconnect array (e.g., the array 100) having mitigated, reduced or eliminated signal crosstalk between conductor pairs (e.g., pairs 106 and 112 or multiple pairs 112) when compared to conventional approaches. The improved system and method of the present invention generally provides for including one or more true twists (e.g., using a crossover section 120) in a trace pair (e.g., the traces 10a and 10b configured as the trace pair 112) that is implemented in a flexible trace conductor interconnect array (e.g., the array 100).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A system for reducing signal crosstalk in a flexible trace interconnect array, the system comprising:
   a flexible dielectric material base;
   a plurality of conductors longitudinally arranged as pairs in a signal layer array on the base, wherein at least one of the pairs of conductors comprises a twisted pair; and
   a shield disposed on the base and the base separates the shield from the plurality of conductors, wherein a portion of the shield forms a crossover lead in a first conductor of the twisted pair, and a zig zag portion of the signal layer forms a crossover lead in a second conductor of the twisted pair.

2. The system of claim 1 further comprising vias to connect the crossover lead portion of the shield to the respective conductor of the twisted pair.

3. The system of claim 1 further comprising at least one other conductor that is substantially parallel to the at least one twisted pair.

4. The system of claim 1 further comprising at least two twisted conductor pairs, and respective crossover points of the conductor pairs are longitudinally separated by a distance selected to minimize crosstalk for a signal having the lowest frequency that is normally transmitted in the system.

5. The system of claim 1 further comprising at least two twisted conductor pairs, and respective crossover points of the conductor pairs are longitudinally separated by randomly unequal distances.

6. The system of claim 1 wherein the conductors comprise at least one of gold, silver, copper, and aluminum.

7. The system of claim 1 wherein the base comprises at least one of polyimide, rubber, teflon, and mylar.

8. A method for reducing signal crosstalk in a flexible trace interconnect array, the method comprising:
   disposing a plurality of conductors arranged as pairs in an array on a flexible dielectric material base;
   forming at least one of the pairs of conductors as a twisted pair;
   disposing a shield on the base; and
   separating the shield from the plurality of conductors using the base, wherein a portion of the shield forms a crossover lead in a first conductor of the twisted pair, and a zig zag portion of the signal layer forms a crossover lead in a second conductor of the twisted pair.

9. The method of claim 8 further comprising forming vias to connect the crossover lead portion of the shield to the respective conductor of the twisted pair.

10. The method of claim 8 further comprising disposing at least one other conductor that is substantially parallel to the at least one twisted pair.

11. The method of claim 8 wherein at least two twisted conductor pairs, and respective crossover points of the conductor pairs are longitudinally separated by a distance selected to minimize crosstalk for a signal having the lowest frequency that is normally transmitted in the system.

12. The method of claim 8 wherein at least two twisted conductor pairs, and respective crossover points of the conductor pairs are longitudinally separated by randomly unequal distances.

13. The method of claim 8 wherein the conductors comprise at least one of gold, silver, copper, and aluminum.

14. The method of claim 8 wherein the base comprises at least one of polyimide, rubber, teflon, and mylar.

15. A flexible trace interconnect array, the array comprising:
   a flexible dielectric material base;
   a plurality of trace conductors disposed as pairs along a longitudinal axis of the base;
   a crossover section formed as a true twist in at least one of the conductor pairs; and
   a shield disposed on the base and the base separates the shield from the plurality of conductors, wherein a portion of the shield forms a crossover lead in a first conductor of the twisted pair, vias connect the crossover lead portion of the shield to the respective conductor of the twisted pair, and a zig zag portion of the signal layer forms a crossover lead in a second conductor of the twisted pair.

16. The array of claim 15 further comprising at least two twisted conductor pairs, and respective crossover points of the conductor pairs are longitudinally separated by a distance selected to minimize crosstalk for a signal having the lowest frequency that is normally transmitted in the system.

17. The array of claim 15 further comprising at least two twisted conductor pairs, and respective crossover points of the conductor pairs are longitudinally separated by randomly unequal distances.

* * * * *